United States Patent
Toba

(10) Patent No.: US 8,134,201 B2
(45) Date of Patent: Mar. 13, 2012

(54) SEMICONDUCTOR MEMORY DEVICE PROVIDED WITH STACKED LAYER GATE INCLUDING CHARGE ACCUMULATION LAYER AND CONTROL GATE, AND MANUFACTURING METHOD THEREOF

(75) Inventor: Takayuki Toba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 12/406,367

(22) Filed: Mar. 18, 2009

(65) Prior Publication Data

US 2009/0278195 A1    Nov. 12, 2009

(30) Foreign Application Priority Data

May 9, 2008    (JP) ................................ 2008-123907

(51) Int. Cl.
*H01L 29/792*    (2006.01)

(52) U.S. Cl. . 257/324; 257/413; 257/536; 257/E27.107; 257/E29.309; 257/E21.21; 438/216; 438/238; 438/258

(58) Field of Classification Search .................. 257/206, 257/288, 296, 300, 324, 326, 368, 369, 390, 257/410, 411, 412, 413, 536, 537, 538, E27.085, 257/E27.107, E29.309, E21.21; 438/197, 438/216, 238, 258, 261, 287, 382, 384, 385, 438/647, 652, 655, 656, 657, 682, 683, 684, 438/685

See application file for complete search history.

(56) References Cited

U.S. PATENT DOCUMENTS

| | | | | | |
|---|---|---|---|---|---|
| 5,849,618 | A | * | 12/1998 | Jeon | 438/254 |
| 5,952,722 | A | * | 9/1999 | Watanabe | 257/754 |
| 6,162,741 | A | | 12/2000 | Akasaka et al. | |
| 6,599,820 | B1 | | 7/2003 | Kanda et al. | |
| 6,785,165 | B2 | * | 8/2004 | Kawahara et al. | 365/185.28 |
| 6,819,590 | B2 | * | 11/2004 | Goda et al. | 365/185.03 |
| 7,045,413 | B2 | | 5/2006 | Lee et al. | |
| 7,675,125 | B2 | * | 3/2010 | Park et al. | 257/390 |

(Continued)

FOREIGN PATENT DOCUMENTS

JP    7-94731    4/1995

OTHER PUBLICATIONS

U.S. Appl. No. 12/407,131, filed Mar. 19, 2009, Sakuma.

*Primary Examiner* — Evan Pert
*Assistant Examiner* — Eduardo A Rodela
(74) *Attorney, Agent, or Firm* — Oblon, Spivak, McClelland, Maier & Neustadt, L.L.P.

(57) ABSTRACT

A semiconductor memory device includes a memory cell transistor and a first MOS transistor. The memory cell transistor includes a first insulating film, a second insulating film, a control gate electrode, and a first diffusion layer. The first insulating film formed on the first active region. The second insulating film formed on the first insulating film. The control gate electrode formed so as to include a first metal film formed on the second insulating film and a first conductive film formed on the first metal film. The first MOS transistor includes a second conductive film, a second metal film, a third conductive film, and a second diffusion layer. The second conductive film formed on a second active region. The second metal film formed on the second conductive film. The third conductive film formed on a second metal film.

17 Claims, 15 Drawing Sheets

U.S. PATENT DOCUMENTS

| | | |
|---|---|---|
| 7,834,387 B2 * | 11/2010 | Booth et al. .................. 257/315 |
| 2004/0251489 A1 * | 12/2004 | Jeon et al. ..................... 257/315 |
| 2005/0157536 A1 | 7/2005 | Kitamura |
| 2006/0118858 A1 * | 6/2006 | Jeon et al. ..................... 257/321 |
| 2007/0275548 A1 * | 11/2007 | Lavoie et al. ................. 438/597 |
| 2008/0121965 A1 * | 5/2008 | Sato et al. ..................... 257/314 |
| 2009/0039414 A1 * | 2/2009 | Lue et al. ...................... 257/324 |
| 2009/0201741 A1 * | 8/2009 | Eitan et al. ............... 365/185.19 |

* cited by examiner

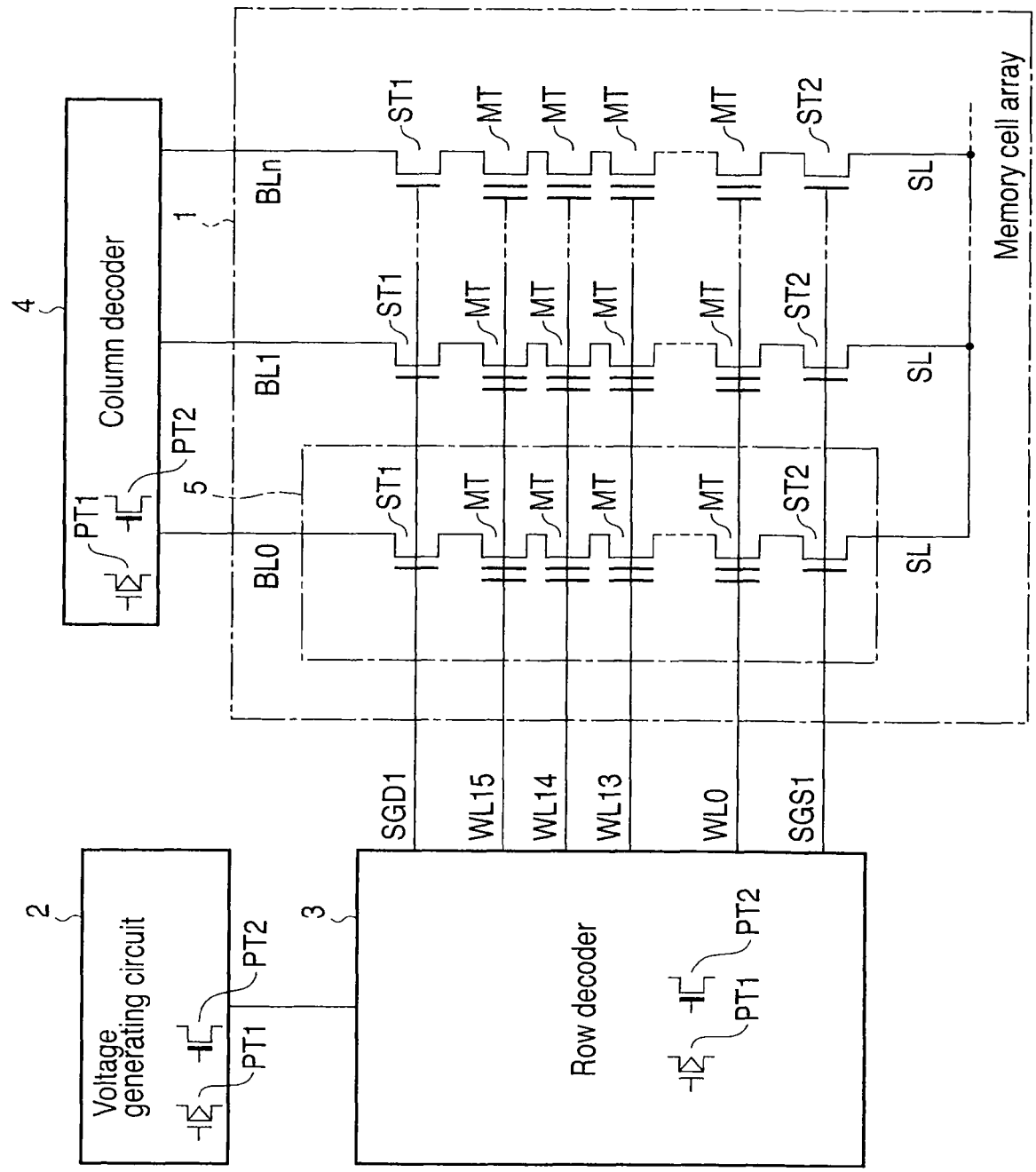
F I G. 1

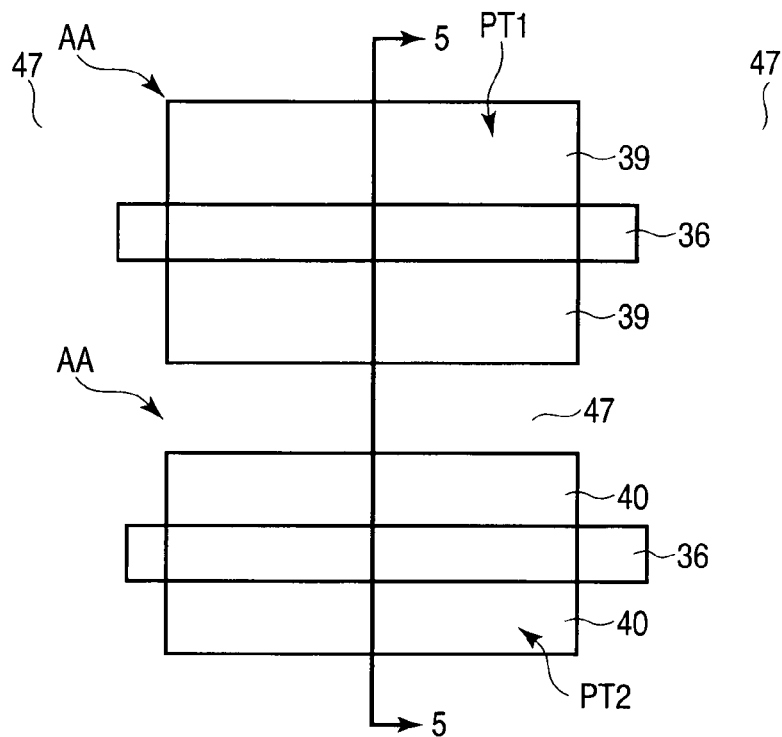
F I G. 4
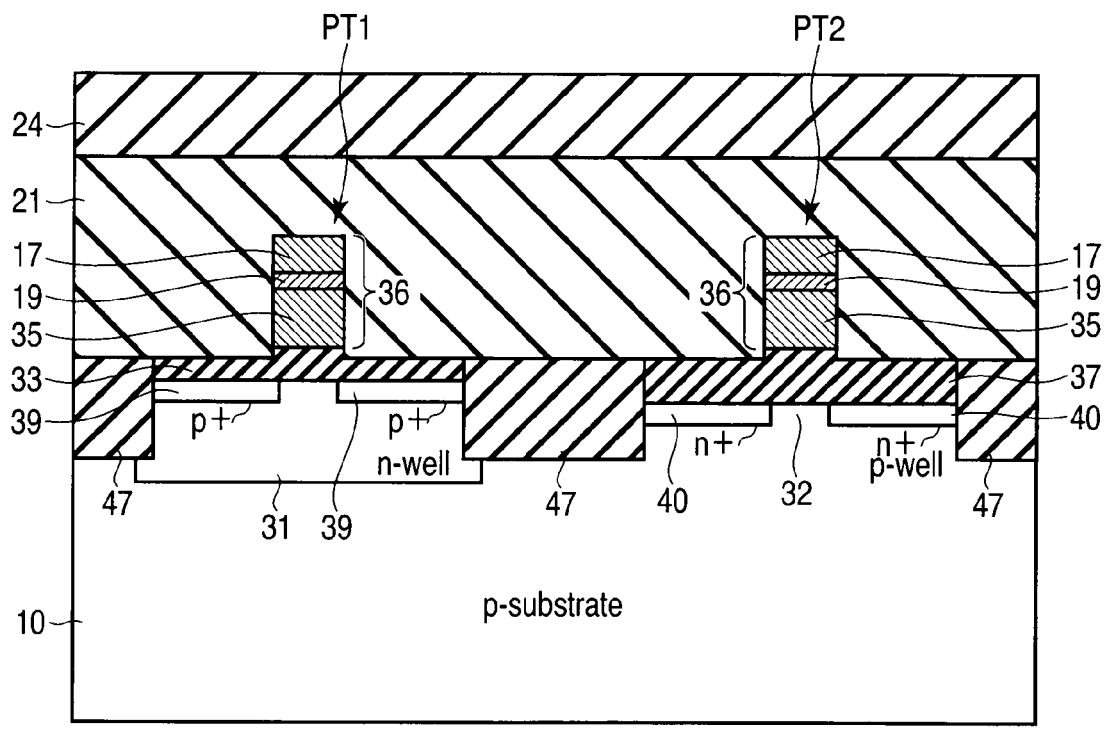
F I G. 5

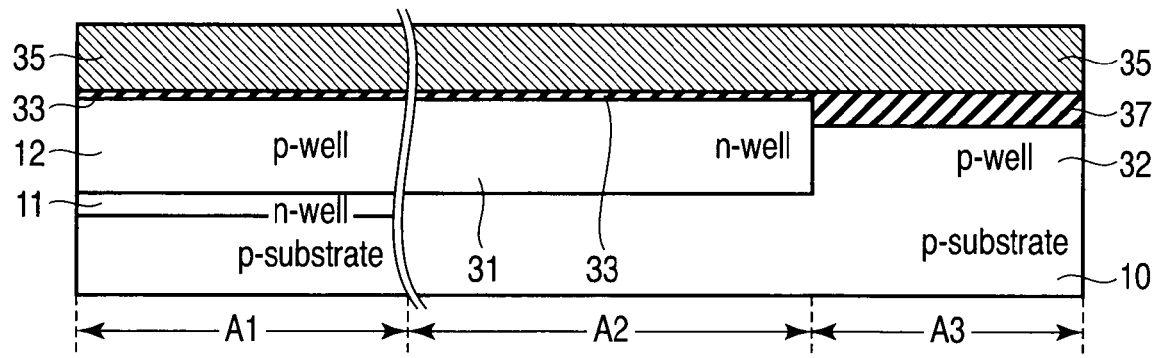
F I G. 6
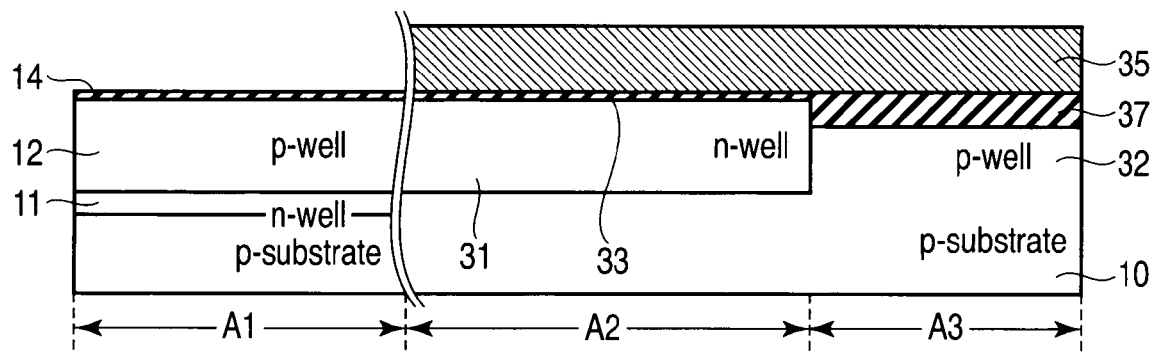
F I G. 7
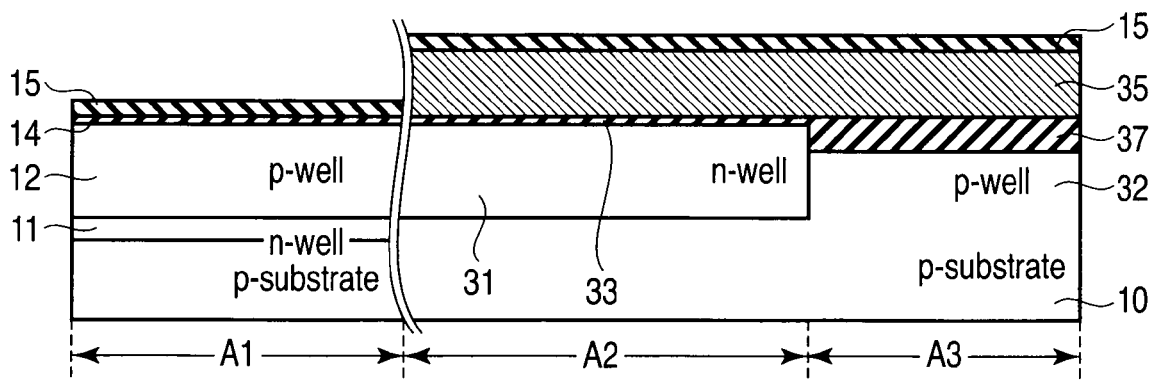
F I G. 8

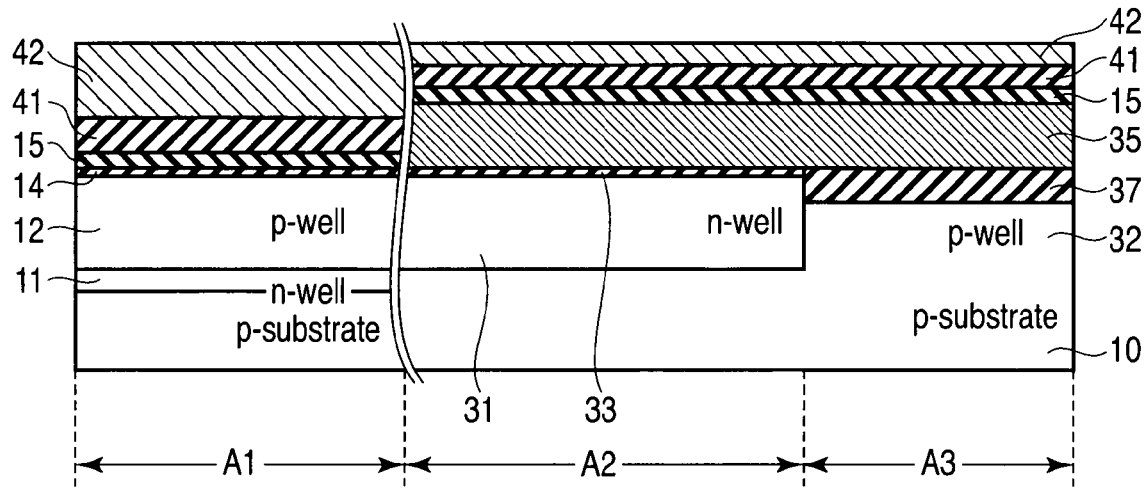
F I G. 9
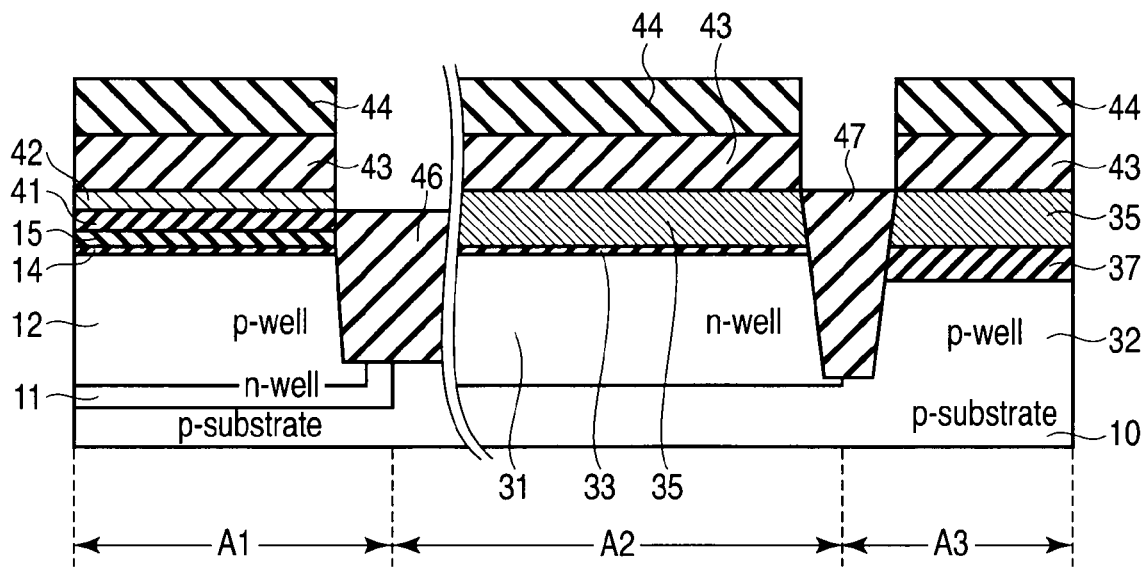
F I G. 10

SEMICONDUCTOR MEMORY DEVICE PROVIDED WITH STACKED LAYER GATE INCLUDING CHARGE ACCUMULATION LAYER AND CONTROL GATE, AND MANUFACTURING METHOD THEREOF

CROSS-REFERENCE TO RELATED APPLICATIONS

This application is based upon and claims the benefit of priority from prior Japanese Patent Application No. 2008-123907, filed May 9, 2008, the entire contents of which are incorporated herein by reference.

BACKGROUND OF THE INVENTION

1. Field of the Invention

The present invention relates to a semiconductor memory device and a manufacturing method thereof.

2. Description of the Related Art

In recent years, a MONOS structure provided with a stacked layer gate including a charge accumulation layer, a block layer, and a control gate is adopted in a memory cell of a NAND flash memory. A MOS structure is adopted in a peripheral circuit.

Therefore, when manufacture of the memory cell and manufacture of the peripheral circuit are attempted in the same step, since the peripheral circuit does not include the charge accumulation layer and the block layer, which is different from the memory cell, a difference in height between a transistor in the memory cell and a transistor in the peripheral circuit occurs.

There is generally polysilicon as material adopted as a control gate for the MONOS structure and a gate electrode in the MOS structure. For example, Jpn. Pat. Applin. KOKAI Publication No. 07-94731 describes that, since the polysilicon is high resistance value, reduction in its resistance can be realized by adopting such an approach as silicidation for causing a surface of the polysilicon to react with high melting point metal in view of low power consumption and speeding-up of an operation speed in a semiconductor memory device. A sufficient resistance value required could have been obtained by silicidation until now.

However, according to high resistance due to shrink of a memory cell and a gate electrode of a peripheral transistor, a sufficient resistance value cannot be obtained by only silicidation of a control gate. Further, as described above, since a height of the MONOS structure and the MOS structure is difference, when the control gate of a memory cell transistor is silicided, a gate of a peripheral transistor is only partially silicided. Even if the gate of a peripheral transistor is silicided, the composition of silicidation is difference. As a result, there is such a problem that operation reliability deteriorates.

BRIEF SUMMARY OF THE INVENTION

A semiconductor memory device according to an aspect of the present invention includes a memory cell transistor provided with a first stacked layer gate including a first insulating film formed on a first active region in a semiconductor substrate via a first gate insulating film, for accumulating charges, a second insulating film formed on the first insulating film using material having dielectric constant higher than that of the first insulating film, and a control gate electrode formed so as to include a first metal film formed on the second insulating film and a first conductive film formed on the first metal film and made of a silicide film, and a first impurity diffusion layer functioning as a source and a drain; and a first MOS transistor provided with a second stacked layer gate including a second conductive film formed on a second active region in the semiconductor substrate via a second gate insulating film, a second metal film formed on the second conductive film, and a third conductive film formed on the second metal film and made of a silicide film, and a second impurity diffusion layer functioning as a source and a drain.

A semiconductor memory device manufacturing method according to an aspect of the present invention includes forming first polysilicon on a first active region via a first gate insulating film;

forming a first insulating film functioning as a charge accumulation layer via a second gate insulating film and a second insulating film having dielectric constant higher than that of the first insulating film and functioning as a block film on the first insulating film in a second active region;

forming a first metal film on the first polysilicon;

forming a second metal film whose upper face coincides with an upper face of the first metal film on the second insulating film;

forming second polysilicon and third polysilicon on the first metal film and the second metal film, respectively;

forming a gate electrode of a memory cell transistor by patterning the third polysilicon, the second metal film, and the first and second insulating films;

forming a gate electrode of a MOS transistor by patterning the first and second polysilicons and the first metal film; and fully siliciding the second and third polysilicons, while preventing silicidation of the first polysilicon by the first metal film.

BRIEF DESCRIPTION OF THE SEVERAL VIEWS OF THE DRAWING

FIG. 1 is a block diagram of a NAND flash memory according to a first embodiment of the present invention;

FIG. 4 is a plan view of a peripheral transistor included in the NAND memory flash memory according to the first embodiment of the present invention;

FIG. 5 is a sectional view of the peripheral transistor, taken along line 5-5 in FIG. 4;

FIGS. 6 to 17 are sectional views showing a first manufacturing step to a twelfth manufacturing step of a memory cell transistor MT and a peripheral transistor PT included in the NAND memory flash memory according to the first embodiment of the present invention;

DETAILED DESCRIPTION OF THE INVENTION

Figure 2:
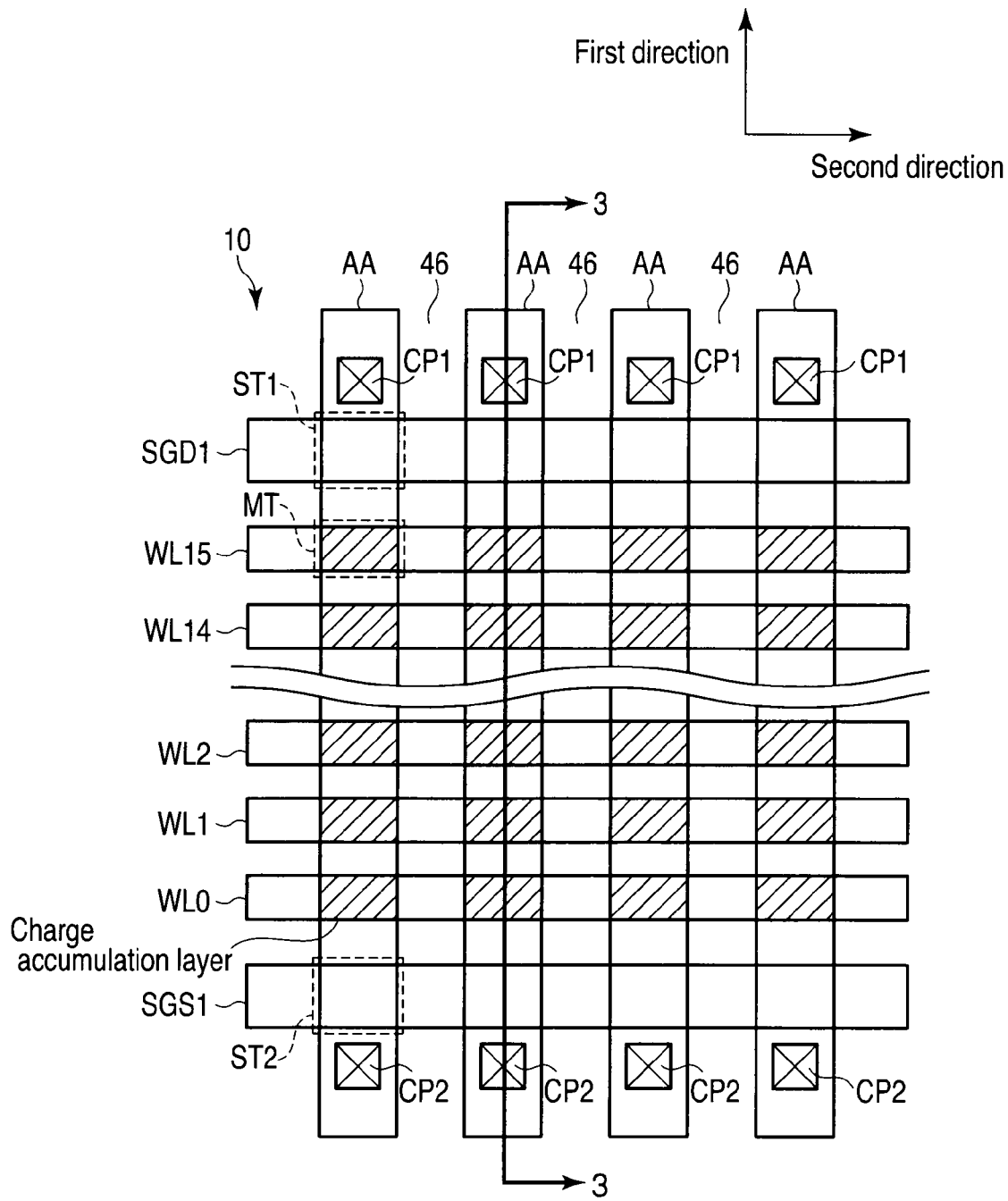
FIG. 2 is a plan view of a memory cell array included in the NAND memory flash memory according to the first embodiment of the present invention.

Embodiments of the present invention will be explained below with reference to the drawings. In this explanation, common portions or parts throughout all figures are attached with same reference numerals.

First Embodiment

A semiconductor memory device and a manufacturing method thereof according to a first embodiment of the present invention will be explained with reference to FIG. 1. Hereinafter, a NAND flash memory will be explained as one example of the semiconductor memory device.

<Overall Configuration Example of NAND Flash Memory>

First, an overall configuration example of a semiconductor memory device will be explained with reference to FIG. 1. FIG. 1 is a block diagram of a NAND flash memory according to the present embodiment.

As shown in FIG. 1, the NAND flash memory is provided with a memory array 1, a voltage generating circuit 2, a row decoder 3, and a column decoder 4.

The memory cell array 1 is provided with a plurality of nonvolatile memory cells which can hold data. Each memory cell is an n-channel MOS transistor provided with, for example, a stacked layer gate including a charge accumulation layer and a control gate. The control gate of the memory cell functions as a word line, a drain thereof is electrically connected to a bit line, and a source thereof is electrically connected to a source line.

The voltage generating circuit 2 generates a voltage to supply the generated voltage to the row decoder 3.

The column decoder 4 selects a column direction of the memory cell array 1 based upon a column address supplied from a control section (not shown). That is, the column decoder 4 selects a bit line BL.

The row decoder 3 selects a row direction of the memory cell array 1 based upon a row address supplied from the control section (not shown) at a write action time of data, at a read action time thereof, and at an erase time thereof. That is, voltage is applied to a select gate lines SGD1 and SGS1, and word lines WL0 to WL15 based upon a row address supplied from the control section.

<Configuration Example of Memory Cell Array 1>

Next, details of a configuration of the memory cell array 1 will be explained with reference to FIG. 1.

The memory cell array 1 is provided with a plurality of NAND cells 5 comprising nonvolatile memory cells which are connected in series and which can hold data. Each of the NAND cells 5 includes 16 memory cell transistors MT and selection transistors ST1 and ST2, for example. The memory transistor MT is an n-channel MOS transistor provided with a stacked layer gate of MONOS type, for example. The stacked layer gate of MONOS type has the following configuration. That is, the stacked layer gate includes a charge accumulation layer (an insulating film) formed on a p-type semiconductor substrate via a gate insulating film, an insulating film (hereinafter, called "block layer") with a dielectric constant higher than that of the gate insulating film, formed on the charge accumulation layer, and a control gate further formed on the block layer. Incidentally, the number of memory cell transistors MT is not limited to 16, but it may be 8, 32, 64, 128, 256, or the like, where the number is not limited to specific ones. In the memory cell transistors MT, adjacent ones share a source and a drain. The memory cell transistors MT are arranged such that current paths thereof are connected in series between the selection transistors ST1 and ST2. A drain region on one end side of the memory cell transistors MT connected in series is connected to a source region of selection transistor ST1, while a source region on the other end side is connected to a drain region of selection transistor ST2.

The control gates of the memory cell transistors MT on the same row are commonly connected to any of the word lines WL0 to WL15, and the gate electrodes of the selection transistors ST1 and ST2 of the memory cell on the same row are commonly connected to the select gate lines SGD1 and SGS1, respectively. For simplification in explanation, when the word lines WL0 to WL15 are not discriminated from one another, they may be simply called "word line WL". In the memory cell array 1, drains of selection transistors ST1 on the same row are commonly connected to any of bit lines BL0 to BLn (n is a natural number). When the bit lines BL0 to BLn are not discriminated from one another, they may be collectively called "bit line BL". The sources of selection transistors ST2 are commonly connected to a source line SL. Incidentally, both of the selection transistors ST1 and ST2 are not required necessarily, but if the NAND cell 5 can be selected, only one of the selection transistors ST1 and ST2 may be provided.

FIG. 1 illustrates only the NAND cell 5 on one raw. However, a plurality of rows of NAND cells 5 may be provided within the memory cell array 1. In this case, the NAND cells 5 in the same column are connected to the same bit line BL. Data is collectively written in a plurality of memory cell transistors MT connected to the same word line WL, whose unit is called "page". Further, data contained in a plurality of NAND cells 5 on the same row is erased collectively, whose unit is called "memory block".

<Configurations of Voltage Generating Circuit 2, Row Decoder 3, and Column Decoder 4>

The voltage generating circuit 2, the row decoder 3, and the column decoder 4 each include a low-voltage MOS transistor using, for example, a voltage VDD (for example, 1.5V) as a power source voltage, and a high-voltage MOS transistor using a voltage higher than the power source voltage of the low-voltage MOS transistor, for example, a voltage VPP (for example, 20V). For simplification in explanation, only a p-channel MOS transistor and an n-channel MOS transistor are respectively explained corresponding to the low-voltage MOS transistor and the high-voltage MOS transistor which are hereinafter called "peripheral transistor PT1 and peripheral transistor PT2".

<Details of Memory Cell Array>

Next, a plan view of the memory cell array 1 with the abovementioned configuration will be explained with reference to FIG. 2. FIG. 2 is a plan view of the memory cell array 1.

As shown in FIG. 2, a plurality of stripe-shaped active regions AA extending in a first direction is provided within a p-type semiconductor substrate 10 along a second direction perpendicular to the first direction. A device isolation region 46 is formed between adjacent active regions AA, so that the active regions AA are electrically separated from each other by the device isolation region 46. Stripe-shaped word lines WL and selection gate lines SGD1 and SGS1 extending in the second direction are formed on the p-type semiconductor substrate 10 so as to cross a plurality of active regions AA. A charge accumulation layer 15 is formed on a region where the word line WL and the active region AA cross each other. A memory cell transistor MT is provided on the region where the word line WL and the active region AA cross each other, and selection transistors ST1 and ST2 are provided on a region where the selection gate lines SGD1 and SGS1, and the active region AA cross each other, respectively. Impurity diffusion layers configuring source regions or drain regions of the memory cell transistor MT and the selection transistors ST1 and ST2 are formed in the active regions AA between the word lines WL, between the selection gate lines and between the word line and the selection gate line which are adjacent in the first direction.

The impurity diffusion layer formed on the active region AA between the selection gate lines SGD1 adjacent in the first direction functions as a drain region of selection transistor ST1. A contact plug CP1 is formed on the drain region. Contact plug CP1 is connected to a stripe-shaped bit line BL (not shown) provided along the first direction. The impurity diffusion layer formed on the active region AA between the selection gate lines SGS adjacent in the first direction functions as a source region of selection transistor ST2. A contact plug CP2 is formed on the source region. Contact plug CP2 is connected to a source line SL (not shown).

Figure 3:
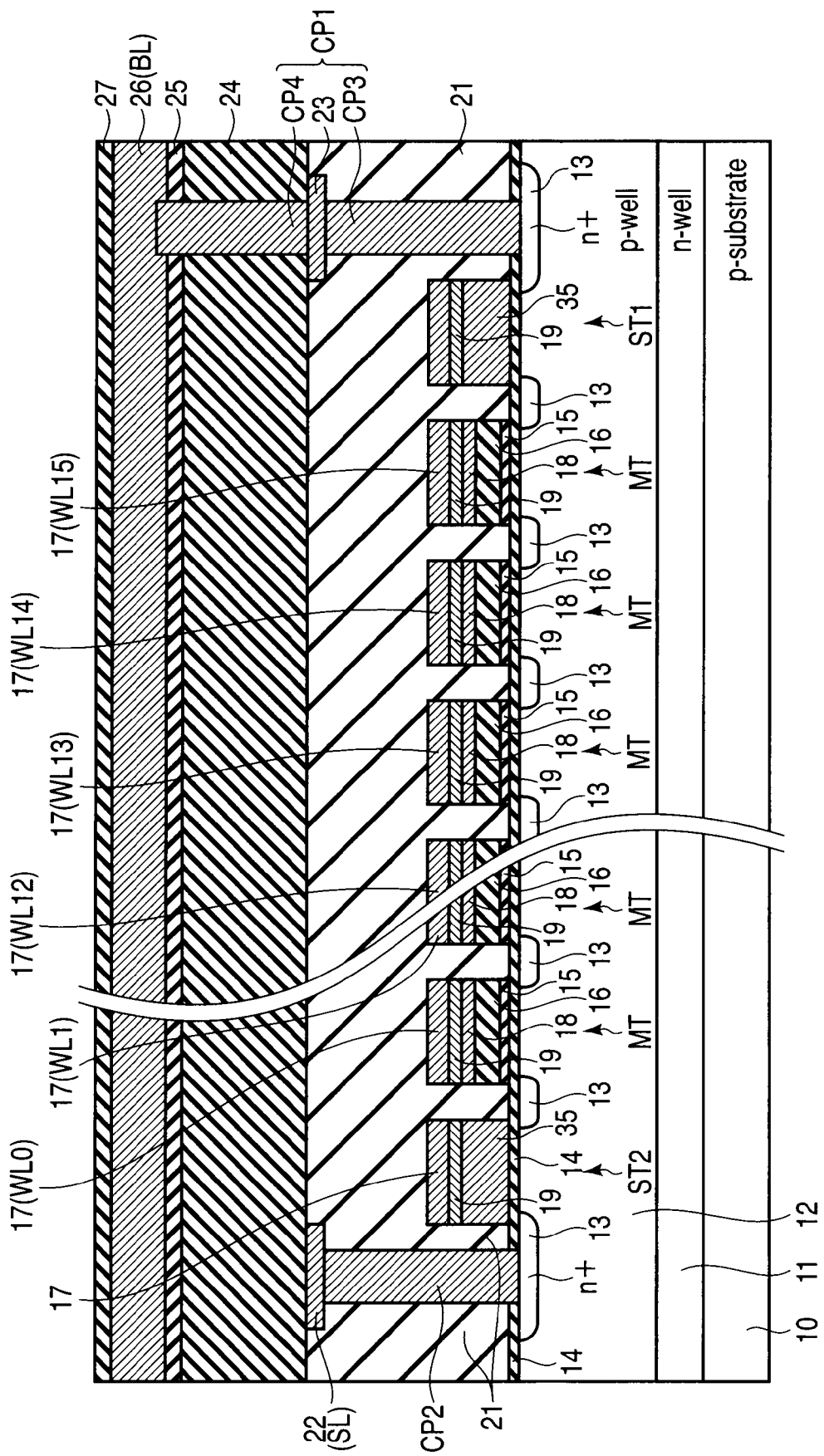
FIG. 3 is a sectional view of the memory cell array, taken along line 3-3 in FIG. 2.

Next, a sectional configuration of the memory cell array 1 with the abovementioned configuration will be explained with reference to FIG. 3. FIG. 3 shows a sectional view of the NAND cell 5, taken along line 3-3 in FIG. 2.

As illustrated in FIG. 3, an n-type well region 11 is formed within a surface region of the p-type semiconductor substrate 10. A p-type well region 12 is formed within a surface region of the n-type well region 11. A gate insulating film 14 is formed on the p-type well region 12, and gate electrodes of the memory cell transistors MT are formed on the gate insulating film 14. The gate electrode of the memory cell transistor MT has a stacked layer structure having a MONOS structure. The stacked layer structure is configured by sequentially forming an insulating film 15, an insulating film 16, a metal film 18, a metal film 19, and a metal silicide layer 17 fully silicided on the gate insulating film 14. The insulating film 16 is formed, for example, using material having a dielectric constant higher than that of material used in the insulating film 15. Material for the metal film 18 is selected such that a barrier height between the metal film 18 and the insulating film 16, namely, a difference between a level of a bottom of a conduction band of the insulating film 16 and a Fermi level of the metal film 18 becomes large in order to improve erase characteristic.

The metal silicide film 17 fully silicided is manufactured by bringing a polysilicon layer and a high melting point metal layer in contact with each other and heating them to a high temperature. The gate electrodes of the selection transistors ST1 and ST2 each have a MOS structure obtained by stacking a polysilicon layer 35 formed on the gate insulating film 14, the metal film 19 formed on the polysilicon film 35, and the metal silicide layer 17 formed on the metal film 19. The metal siliside layer 17 of each of the peripheral transistors ST1 and ST2 is also a metal silicide layer fully silicided.

In the memory cell transistor MT, the insulating film 15 functions as a charge accumulation layer accumulating charges, the insulating film 16 functions as a block layer confining charges in the insulating film 15, and the metal silicide layer 17 functions as a control gate. The metal silicide layer 17 is commonly connected to one adjacent thereto in the second direction perpendicular to the first direction in FIG. 2 and it functions as a control gate electrode (word line WL). The insulating films 15 and 16, and the metal silicide layer 17 can be hereinafter called "charge accumulation layer 15", "block layer 16", and "control gate 17", respectively. In the selection transistors ST1 and ST2, the metal silicide layer 17 is commonly connected to one adjacent thereto in the second direction. The metal film 19, the metal silicide layer 17, and the polysilicon layer 35 each function as one of the selection gate lines SGS1 and SGD1.

An $n^+$-type impurity diffusion layer 13 is formed within a surface of the well region 12 positioned between the gate electrodes. The impurity diffusion layer 13 is shared by transistors adjacent to each other and it functions as a source (S) or a drain (D). A region between a source and a drain adjacent to each other functions as a channel region configuring a movement region for electrons. Transistors configuring the memory cell transistor MT and the selection transistors ST1 and ST2 are formed of the gate electrode, the $n^+$-type impurity diffusion layer 13, and the channel region.

An interlayer insulating film 21 is formed on the p-type semiconductor substrate 10 so as to cover the memory cell transistor MT, and the selection transistors ST1 and ST2. A contact plug CP2 reaching the impurity diffusion layer (source) 13 of selection transistor ST2 on the source side is formed in the interlayer insulating film 21. A metal interconnect layer 22 connected to contact plug CP2 is formed on a surface of the interlayer insulating film 21. The metal interconnect layer 22 functions as a portion of the source line SL. A metal interconnect layer 23 connected to a contact plug CP3 reaching the impurity diffusion layer (drain) 13 of selection transistor ST1 on the drain side is formed in the interlayer insulating film 21. An interlayer insulating film 24 is formed on the interlayer insulating film 21. An interlayer insulating film 25 is formed on the interlayer insulating film 24. A metal interconnect layer 26 is formed on the interlayer insulating film 25. The metal interconnect layer 26 functions as a bit line BL. A contact plug CP4 whose upper face contacts with the metal interconnect layer 26 and whose bottom face contacts with the metal interconnect layer 23 is formed in the interlayer insulating films 24 and 25. Contact plug CP3, the metal interconnect layer 23, and contact plug CP4 function as a contact plug CP1 in FIG. 2. An insulating film 27 is formed on the metal interconnect layer 26.

<Structures of Peripheral transistors PT1 and PT2>

Next, structures of the peripheral transistors PT1 and PT2 contained in the voltage generating circuit 2, the row decoder 3, and the column decoder 4 will be explained with reference to FIG. 4. FIG. 4 is a plan view of the peripheral transistors PT1 and PT2.

As shown in FIG. 4, two active regions AA are formed so as to be surrounded by a device isolation region 47. Gate electrodes 36 extending up to device isolation region 47 are formed so as to cross the active regions AA laterally. An $n^+$ impurity diffusion layer 40 and a $p^+$ impurity diffusion layer 39 are each formed so as to sandwich the gate electrode 36.

Next, sectional configurations of the peripheral transistors PT1 and PT2 will be explained with reference to FIG. 5. The peripheral transistors PT1 and PT2 are formed on the same semiconductor substrate 10, as the memory cell array 1. FIG. 5 is a sectional view of the peripheral transistors PT1 and PT2 along a channel longitudinal direction (line 5-5) in FIG. 4.

An n-type well 31 is formed within a surface region of the p-type semiconductor substrate 10. The n-type well region 31 and a portion of the p-type semiconductor substrate 10 are surrounded by a device isolation region 47 so that the n-type well region 31 and the p-type semiconductor substrate 10a are electrically isolated from each other. A low-voltage peripheral transistor PT1 is formed on the n-type well region 31, and a high-voltage peripheral transistor PT2 is formed on a p-type semiconductor substrate 10 (hereinafter, called "high-voltage transistor formation region 32") whose periphery is surrounded by the device isolation region 47. Incidentally, a p-type well region may be formed on the high-voltage transistor formation region 32.

That is, a gate insulating film 33 is formed on the n-type well region 31. A gate electrode 36 of peripheral transistor PT1 is formed on the gate insulating film 33. The gate electrode 36 has a three-layered structure, and it is obtained by forming a polysilicon layer 35, a metal film 19, and a metal silicide layer 17 on the gate insulating film 33 in this order. A gate insulating film 37 is formed on the high-voltage transistor formation region 32 and a gate electrode 36 of peripheral transistor PT2 is formed on the gate insulating film 37. In peripheral transistor PT2, the gate electrode 36 also has a three-layered structure like peripheral transistor PT1, and it is obtained by sequentially forming the polysilicon layer 35, the metal film 19, and the metal silicide layer 17 on the gate insulating film 33 in this order. A film thickness of the gate insulating film 37 of peripheral transistor PT2 is larger than that of the gate insulating film 33 of peripheral transistor PT1. This is because a voltage higher than that applied to peripheral transistor PT1 is applied to peripheral transistor PT2.

A $p^+$-type impurity diffusion layer 39 functioning as the source or the drain of peripheral transistor PT1 is formed within a surface of the n-type well region 31. An $n^+$-type impurity diffusion layer 40 functioning as the source or the drain of peripheral transistor PT2 is formed within a surface of the p-type well region of the high-voltage transistor formation region 32. The impurity diffusion layers 39 and 40 are respectively connected to contact plugs (not shown) to be applied with voltages through the contact plugs. A region between the source and the drain adjacent to each other functions as a channel region configuring a movement region for electrons or holes. The MOS transistors configuring the peripheral transistors PT1 and PT2 are formed by the gate electrode 36, the impurity diffusion layer 39 or 40, and the channel region. Incidentally, impurity concentration profiles of the impurity diffusion layers 39 and 40 along a depth direction of the semiconductor substrate are different according to characteristics required for the peripheral transistors PT1 and PT2 and they are different from an impurity concentration profile of the impurity diffusion layer 13 of the memory cell transistor MT.

An interlayer insulating film 21 is formed on the p-type semiconductor substrate 10 so as to cover the peripheral transistors PT1 and PT2 positioned to sandwich the device isolation region 47. An interlayer insulating film 24 is formed on the interlayer insulating film 21. A contact plug (not shown) is embedded so as to extend through the interlayer insulating films 21 and 24.

<Manufacturing Method of Memory Cell Array 1 and Peripheral Transistors PT1 and PT2>

Next, a manufacturing method of the memory cell array 1 and the peripheral transistors PT1 and PT2 will be explained with reference to FIGS. 6 to 17. FIGS. 6 to 17 are sectional views sequentially showing manufacturing steps of the memory cell array 1 and the peripheral transistors according to the present embodiment, where the memory cell transistor MT and the peripheral transistors PT1 and PT2 are shown.

As shown in FIG. 6, respective regions on the p+ semiconductor substrate 10 are defined as a region scheduled for forming the NAND cell 5 (hereinafter, called "region A1"), a region scheduled for forming peripheral transistor PT1 (hereinafter, called "region A2"), and a region scheduled for forming peripheral transistor PT2 (hereinafter, called "region A3"). A surface of region A3 is recessed using anisotropic etching such as reactive ion etching (RIE). Thereafter, a sacrifice oxidation film is formed on a surface of the p-type semiconductor substrate 10. The sacrifice oxidation film is for protecting an upper face of the semiconductor substrate 10 at an ion-implantation time.

Thereafter, an n-type well region 11 is formed within the semiconductor substrate 10 in region A1, and a p-type well region 12 is formed on a surface of the semiconductor substrate 10 from on the n-type region 11. An n-type well region 31 is formed within a surface of region A2 of the p-type semiconductor substrate 10. The p-type well region 12, and the n-type well regions 11 and 31 are formed to have kinds of proper impurities and proper concentration profiles according to characteristics required for the respective transistors.

Two well regions of the p-type well 12 formed with the memory cell transistor MT and the n-type well region 31 formed with peripheral transistor PT1 are generally different in impurity concentration profile along the depth direction. Since the well region formed with the low-voltage peripheral transistor and the well region formed with the high-voltage peripheral transistor are different in breakdown voltage required for a transistor, even if conduction types of the transistors are the same, these well regions are generally formed using different impurities. There is such a case that a p-type well region is formed in region A3.

After the sacrifice oxidation layer is peeled off, a high-voltage gate insulating film 37 for peripheral transistor PT2 is formed on a surface of the p-type semiconductor substrate 10. Thereafter, the gate insulating film 37 is patterning, and the insulating films 37 in regions A1 and A2 are removed. Further, a gate insulating film 33 using, for example, $SiO_2$ as material is formed on regions A1 and A2 such that a height of an upper face thereof coincides with a height of an upper face of the gate insulating film 37. Next, a polysilicon film 35 is formed on the gate insulating film 33 and the gate insulating film 37.

As shown in FIG. 7, the polysilicon layer 35 and the gate insulating film 33 are removed in region A1. Thereafter, a gate insulating film 14 is formed in region A1, namely, on the p-type well region 12, using, for example, $SiO_2$ as material. The gate insulating film 14 functions as a tunnel insulating film in the memory cell transistor MT.

As shown in FIG. 8, an insulating film 15 comprising, for example, a silicon nitride film is formed on the gate insulating film 14 and the polysilicon layer 35.

As shown in FIG. 9, an insulating film 41 using, for example, $SiO_2$ as material and a polysilicon layer 42 are sequentially formed on the insulating film 15. Thereafter, the polysilicon layer 42, the insulating film 41, and the insulating film 15 are removed by using anisotropic etching such as, for example, RIE process or the like such that the insulating film 15 formed on the polysilicon layer 35 is removed. As a result, the insulating film 41 and the polysilicon layer 42 remain in region A1. At this time, an upper face of the polysilicon layer 42 is caused to coincide with an upper face of the polysilicon layer 35.

Subsequently, a SiN film 43 functioning as a mask material and an insulating film 44 using, for example, $SiO_2$ as material are sequentially formed on upper faces of the polysilicon layers 35 and 42. Further, a photoresist film (not shown) is formed on the insulating film 44 and a portion other than regions scheduled for forming device isolation regions 46 and 47 by a photolithography step. Further, the insulating film 44 in a region where the photoresist film is not formed, namely, the photoresist film is opened is etched using anisotropic etching. Subsequently, the SiN film 43, the polysilicon layer 35, and the gate insulating films 33 and 37 are etched in an anisotropic manner. As shown in FIG. 10, a trench whose bottom reaches inside of the semiconductor substrate 10 is completed according to the abovementioned steps. Further, an insulating film comprising, for example, a silicon insulating film or tetraethyl-orthosilicate (TEOS) is formed so as to fill the trench inside, and an upper face of the insulating film is then polished by chemical mechanical polishing (CMP)

using the SiN film 43 as a stopper or the like so that. Then the upper face of the silicon insulating film flashes. After the SiN film 43 is removed by wet-etching, an upper face of the insulating film is etched such as the upper face of the insulating film coincides with respective upper faces of the polysilicon films 35 and 41, while adjustment of an etching amount of the wet-etching is being performed. As a result, device isolation regions for separating the semiconductor substrate 10 to a plurality of active regions AA are formed. Here, in FIG. 10, device isolation regions 46 and 47 are respectively formed between the memory cell array 1 and peripheral transistor PT1, namely, between regions A1 and A2, and between peripheral transistor PT1 and peripheral transistor PT2, namely, between regions A2 and A3 such that bottom sides thereof contact with the inside of the semiconductor substrate.

Figure 11:
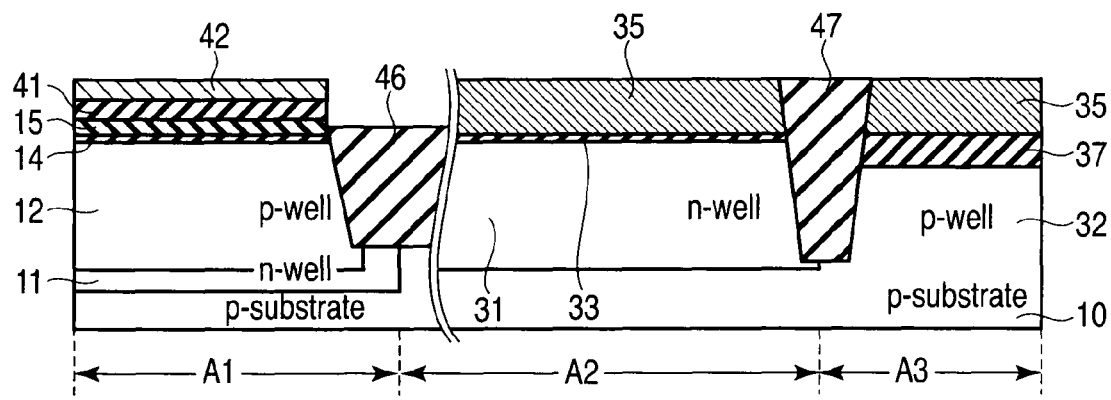

Thereafter, after regions A2 and A3 are covered with a photoresist film according to a photolithography step, an upper face of the device isolation region 46 adjacent to the p-type well region 12 in region A1 is recessed using, for example, wet-etching. When the device isolation region 46 is recessed at this step, an etching amount is adjusted such that an upper face of the device isolation region 46 is lower than an upper face of the insulating film 15 and higher than a lower face of the insulating film 15. Thereafter, a state shown in FIG. 11 is obtained by removing the photoresist film. Incidentally, a position of the upper face of the device isolation region 47 may be higher than an upper face of the insulating film 15 or lower than a lower face of the insulating film 15. An upper portion of the device isolation region 47 in region A3 is not recessed in view of prevention of formation of an inversion layer formed on a bottom of the device isolation insulating film 47.

Figure 12:
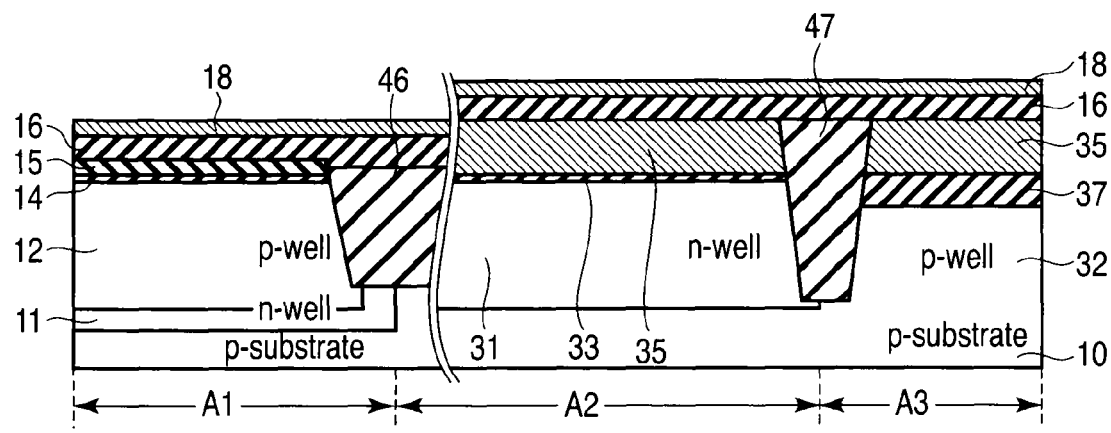

As shown in FIG. 12, the insulating film 41 and the polysilicon layer 42 remaining in region A1 are removed by wet-etching. Here, such a case occurs that an upper portion of the device isolation region 46 is also removed due to a relationship of an etching ratio. In such a case, such adjustment is performed that the upper face of the device isolation region 46 in FIG. 11 is made higher than the upper face of the insulating film 15, the upper face of the device isolation region 46 is lower than the upper face of the insulating film 15 and higher than the lower face of the insulating film 15 after etching of the insulating film 41 and the polysilicon layer 42. An insulating film 16 completed, for example, $Al_2O_3$ is formed on upper faces of the insulating film 15, the polysilicon layer 35, and the device isolation regions 46 and 47, and a metal film 18 is further formed on the insulating film 16. Incidentally, a plurality of metal films 18 may be formed in order to raise barrier height between the metal film 18 and the insulating film 16.

Figure 13:
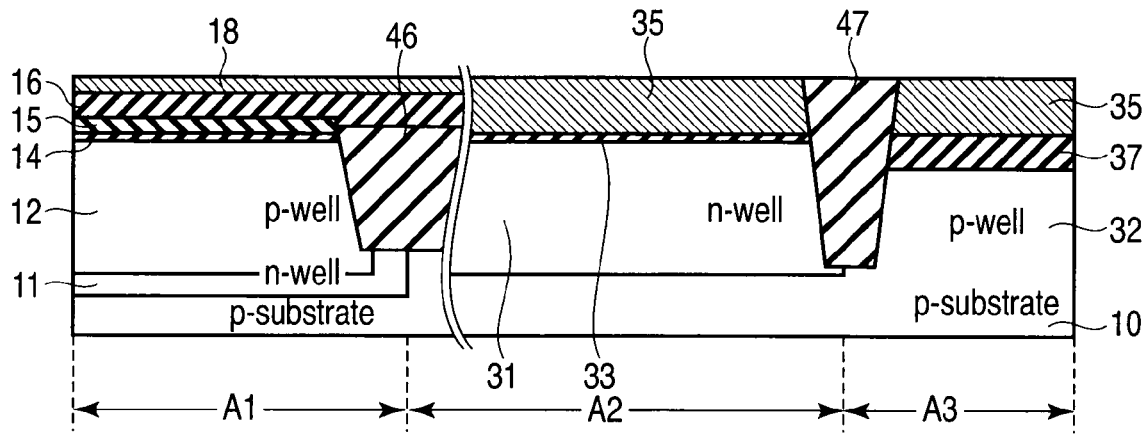

As shown in FIG. 13, the insulating film 16 and the metal film 18 formed in regions A2 and A3 are removed by anisotropic etching such as RIE process.

Figure 14:
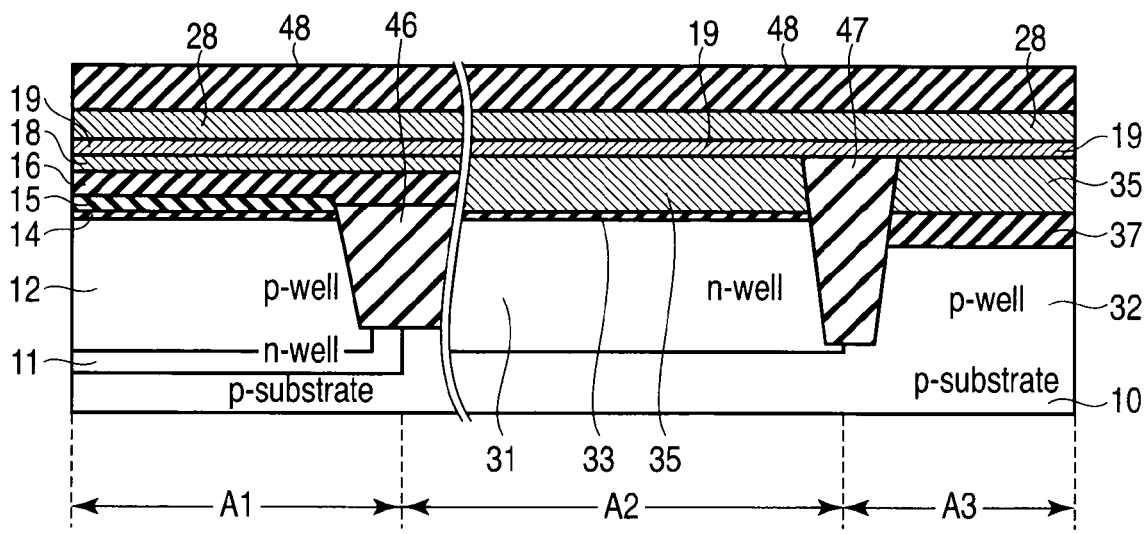

As shown in FIG. 14, a metal film 19 is formed on the metal film 18 and the device isolation region 46 formed in region A1 and the device isolation region 47 and the polysilicon layer 35 in regions A2 and A3, respectively. A polysilicon layer 28 is formed on the metal film 19. A SiN film 48 functioning as mask material is formed on the polysilicon layer 28.

Figure 15:
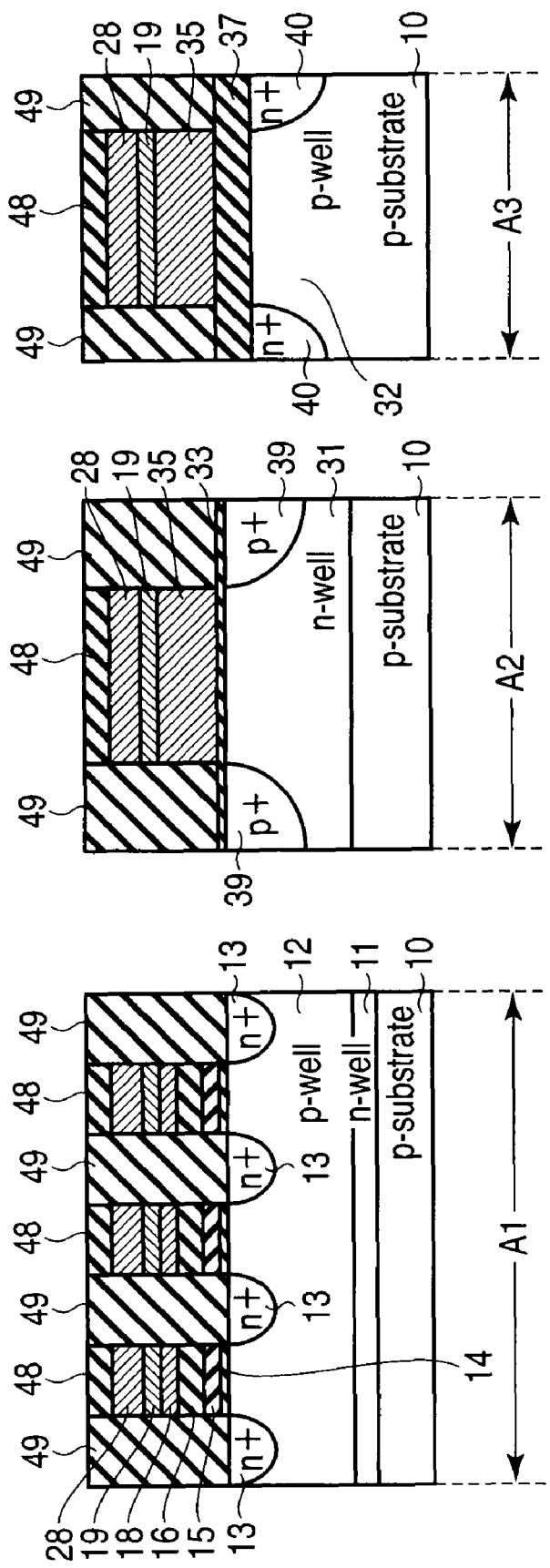

Next, a configuration shown in FIG. 15 is obtaining by patterning the SiN film 48, the polysilicon layer 28, the metal films 18 and 19, the insulating film 15, and the insulating film 16 to a pattern for a gate electrode using a photolithography step and a dry-etching step. That is, a stacked layer gate including a charge accumulation layer formed of the insulating film 15, a block layer formed of the insulating film 16, the metal films 18 and 19 containing TiN, TaN or the like as material, and a control gate formed of the polysilicon layer 28 is completed in region A1. Since the barrier height between the metal film 19 and the insulating film 16 can be adjusted by the metal film 19, a step for the metal film 18 can be omitted.

A gate electrode shown in FIG. 15 is completed in each of regions A2 and A3 by patterning the SiN film 48, the polysilicon layer 28, the metal film 19, and the polysilicon layer 35 to a pattern for the gate electrode. Incidentally, gate electrodes for the selection transistors ST1 and ST2 (not shown) are formed so as to have configurations similar to the gate electrodes for the peripheral transistors PT1 and PT2. The SiN film 48 remains on the polysilicon layer 28. Impurity diffusion layers 13, 39, and 40 functioning as the source and the drain are formed by implanting impurity in the well regions 12, 31, and 32 using the SiN film 48 as mask and utilizing a photolithography step and an ion implanting step. The ion implanting step is performed using a proper implantation amount, a proper ion kind, and a proper acceleration voltage to each transistor. After the impurity is implanted, anneal is performed, for example, at a temperature of 950° C. for activating the implanted ion. Thereafter, as illustrated in FIG. 15, an interlayer insulating film 49 is deposited on a whole surface of the semiconductor substrate 10. Subsequently, the interlayer insulating film 49 is formed among the memory cell transistor MT, the peripheral transistors PT1, and PT2 such that an upper face thereof is flush with the upper face of the SiN film 48 using the SiN films 48 included in the gate electrode as a stopper by, for example, CMP process.

Figure 16:
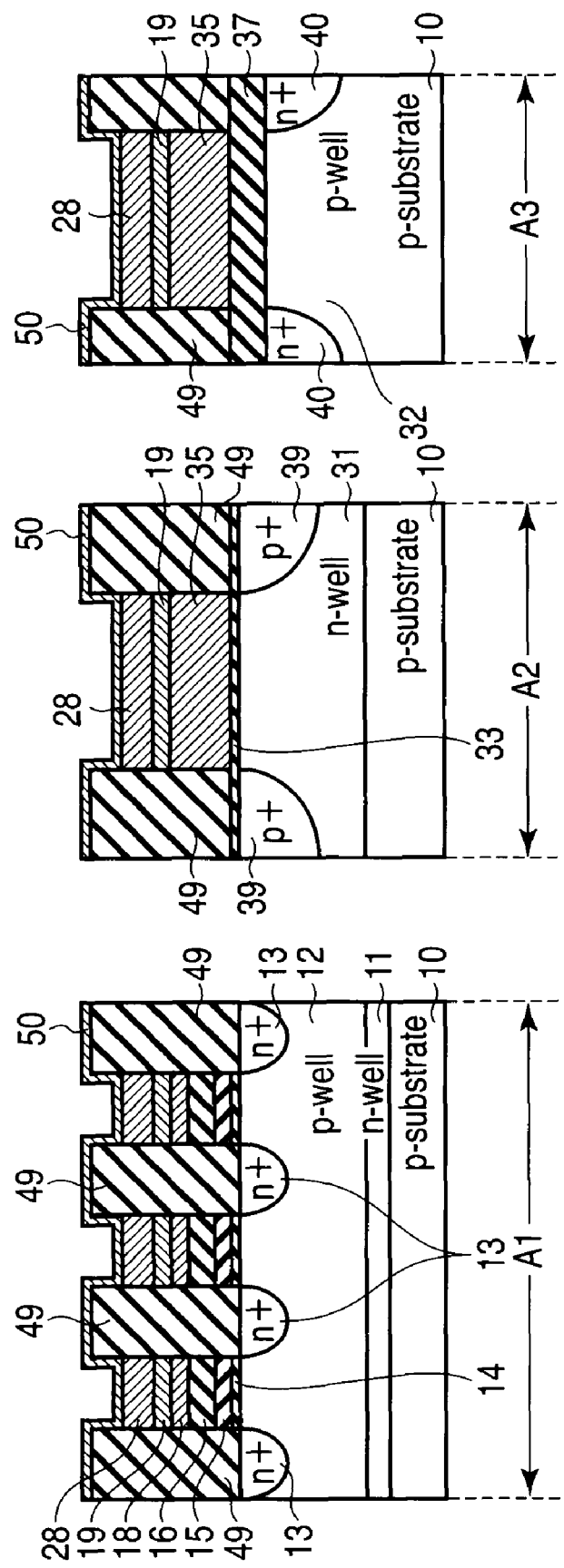
Figure 17:
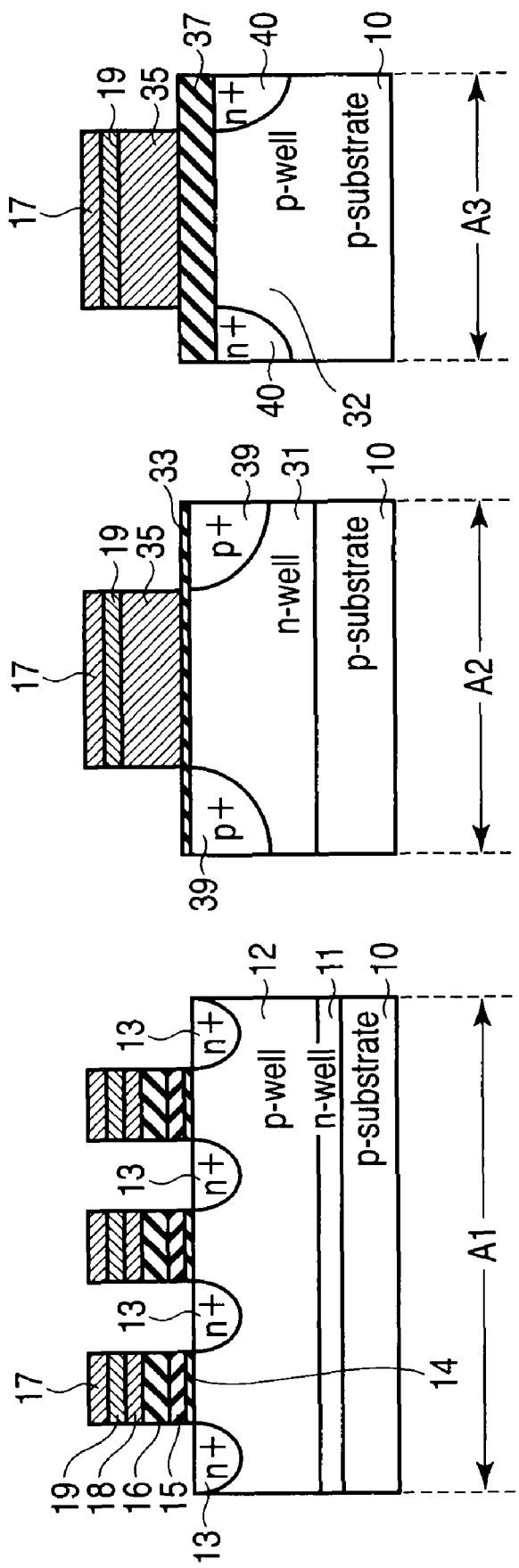

Thereafter, as shown in FIG. 16, the SiN film 48 is removed by anisotropic etching such as RIE process or wet-etching to expose an upper face of the polysilicon layer 28. A metal film 50 such as, for example, a Ni layer is formed on upper faces of the polysilicon layer 28 and the interlayer insulating film 49 in order to fully silicide the polysilicon layers 28 of the memory cell transistor MT, and the peripheral transistors PT1 and PT2. Thereafter, the polysilicon layers 28 are fully silicided by annealing Ni at a temperature range from 300 to 600° C. or annealing Co at a temperature range from 500 to 900° C. Here, the term "full silicidation or fully silicided" does not mean siliciding only a surface of a polysilicon layer but it means completely siliciding the polysilicon layer till silicidation reaches inside of the polysilicon layer. At this time, the metal films 19 function as stopper to silicidation in the peripheral transistors PT1 and PT2, so that the polysilicon layers 28 are silicided. The memory cell transistor MT, peripheral transistor PT1 and peripheral transistor PT2 shown in FIG. 17 are obtained via the abovementioned steps.

Silicidation can be progressed from a side face of the polysilicon layer 28 by making the upper face of the interlayer insulating film 49 lower than the upper face of the polysilicon layer 28 by etching. As a result, the metal silicide layer 17 can be formed with a time shorter than a case that the metal film 50 is formed on the upper face of the polysilicon layer 28. Incidentally, it is necessary to make a position of the upper face of the interlayer insulating film 19 higher than the lower face of the polysilicon layer 28 in order to prevent metal atom diffusion from the metal film 50 to a lower layer such as the polysilicon layer 35.

Incidentally, when the metal film 18 and the insulating film 16 in regions A2 and A3 are removed by anisotropic etching such as RIE process at the step shown in FIG. 13, the upper face of the polysilicon layer 35 coincides with the upper face of the metal film 18. This is because the polysilicon layer 35 formed at the step shown in FIG. 6 is formed to have such a film thickness that the upper face thereof coincides with the upper face of the metal film 18 included in the memory cell transistor MT in advance. At the step shown in FIG. 13, if the upper face of the polysilicon layer 35 is higher than the upper face of the metal film 18, then the upper face of the polysilicon layer 35 coincides with the upper face of the metal film 18 by RIE process above. When the upper face of the polysilicon layer 35 is lower than the upper face of the metal film 18, a polysilicon layer 35 is further formed on an upper face of the polysilicon layer 35 formed in regions A2 and A3 such that an upper face thereof coincides with the metal film 18. Thereby, the upper faces of the metal films 19 and the polysilicon layers 28 included in the memory cell transistor and the peripheral transistors PT1 and PT2 shown in FIGS. 14 to 17 coincide with each other. As a result, process margin of the pattern of the gate electrodes shown in FIG. 15 can be improved.

An interlayer insulating film 21 is formed on the p-type semiconductor substrate 10 so as to cover the memory cell transistor MT and the peripheral transistors PT1 and PT2. Contact plugs CP1 and CP2 having characteristic of high melting point metal such as, for example, tungsten or molybdenum and a metal interconnect layer made of aluminum, copper or the like are formed on the interlayer insulating film 21. Thereby, the memory cell transistor MT and the peripheral transistors PT1 and PT2 shown in FIGS. 2 to 4 can be obtained.

Effect According to this Embodiment

As described above, according to the semiconductor memory device and a manufacturing method thereof according to the first embodiment, operation reliability can be improved. The effect can be explained below in detail while being compared with the semiconductor memory device in the conventional art.

There is conventionally a demand for resistance reduction of gates of the memory cell transistors MT and the peripheral transistors PT in the semiconductor memory device. There is a method for siliciding a whole gate (fully siliciding the gate). However, a technique for full silicidation includes the following problems. A gate electrode of a memory cell transistor and a gate electrode of a peripheral transistor are generally simultaneously formed at the same or one manufacturing process. However, since the gate electrode of the memory cell transistor includes a charge accumulation layer and a block layer, a film thickness of a control gate to be fully silicided is considerably smaller than that of the gate electrode of the peripheral transistor. Accordingly, when the control gate is fully silicided under an optimized condition to the control gate, the gate electrode of the peripheral transistor is only partially silicided. A region of the gate electrode of the peripheral transistor to be silicided is considerably largely fluctuated. Further, a composition ratio of a silicide film in the peripheral transistor fluctuates according to the condition. The fluctuation influences characteristics of the peripheral transistor, for example, a threshold voltage or the like. As a result, it becomes difficult to form a MOS transistor as designed due to fluctuation occurring in fully siliciding, which results in adverse effect on reliability of a NAND flash memory.

Therefore, in the conventional art, only the control gate of the memory cell transistor MT is fully silicided and the gate of the peripheral transistor is not silicided at all. However, in order to fully silicide only the control gate of the memory cell transistor MT, it is necessary to form an insulating film made of SiN or the like as silicidation preventing film to cover the gate of the peripheral transistor PT with the insulating film when the control gate of the memory cell transistor MT is silicided. This is performed in order to prevent silicidation of the peripheral transistor PT. Further, thereafter, it is necessary to perform an extra step of removing the silicidation preventing film used for the covering. Therefore, the manufacturing steps are very complicated. Therefore, as described in BACKGROUND OF THE INVENTION in this text, a technique of reducing resistance of gates by siliciding surfaces of the control gate of the memory cell transistor and the gate electrode of the peripheral transistor has been adopted in order to save time and labor. When the conventional gate width of the gate electrode is adopted, sufficiently reduced resistance can be achieved by only siliciding a portion of the control gate, but sufficient resistance reduction cannot be obtained according to advance of fineness of the control gate recently by only siliciding only the surface of the gate. That is, resistances of the memory transistor MT and the peripheral transistor PT have been increased.

Therefore, it has been required to perform the abovementioned full silicidation in order to satisfy such a demand to reduce resistances of the gates of the memory cell transistors MT and the peripheral transistors PT. As explained above, however, there is a problem of the fluctuation. Further, even if the gate is silicided, there is a problem of change of the composition ratio, which causes a problem regarding operation reliability. However, these problems can be solved by the present embodiment. The effect of the embodiment will be explained below.

With the configuration according to the present embodiment, the metal films 18 and 19 are provided on the gate electrode of the memory cell transistor. The metal film 19 whose upper face coincides with the upper face of the metal film 19 included in the gate electrode of the memory cell transistor is provided in the gate electrode of the MOS transistor. The metal films 18 and 19 are used as stopper films for full silicidation. That is, a region positioned above the metal film 19 is a region to be silicided, and a region below the metal film 19 is not silicided.

That is, a region is reduced as compared with a region to be silicided in the conventional art. Therefore, fluctuation in silicidation occurring in the gate electrode of the peripheral transistor can be reduced. Namely, a region to be silicided and a region not to be silicided are determined at a design time, and a whole region to be silicided is silicided and a region not to be silicided is prevented from being silicided by the metal film 19. As a result, fluctuation regarding a range and a degree of silicidation of the peripheral transistor is excluded so that a designed characteristic to the peripheral transistor can be obtained. Thereby, reliability of a NAND flash memory can be improved.

The control gate which is the region to be silicided in the memory cell transistor and the polysilicon layer 28 which is the region to be silicided in the peripheral transistor have the same thickness. Accordingly, regions to be silicided in the memory cell transistor and in the peripheral transistor can be made approximately equal to each other. As a result, when the control gate of the memory cell transistor MT is fully silicided under an optimal condition, the gate of the peripheral transistor can also be fully silicided under an optimal condition like the control gate of the memory cell transistor MT, as compared with a case that film thickness of the gates of the memory cell transistor MT and the peripheral transistor PT are different from each other.

When the film thickness of the gate of the peripheral transistor is larger than that of the control gate of the memory cell transistor MT, even if full silicidation is performed to the control gate of the memory cell transistor MT under the optimal condition, the gate of the peripheral transistor PT is not evenly fully silicided, as explained above. When full silicidation is performed to the gate of the peripheral transistor PT under the optimal condition, the control gate of the memory cell transistor MT is exposed to thermal treatment excessively. That is, the gate electrode of the memory cell transistor MT may deteriorate. However, according to the semiconductor memory device and the manufacturing method thereof according to the present embodiment, the gate of the peripheral transistor PT can be fully silicided in a minimal thermal processing for fully siliciding the control gate of the memory cell transistor MT.

Second Embodiment

Next, a semiconductor memory device and a manufacturing method thereof according to a second embodiment of the present invention will be explained. In the present embodiment, a case that a resistance element is formed together with the memory cell transistor explained in the first embodiment will be explained.

Figure 18:
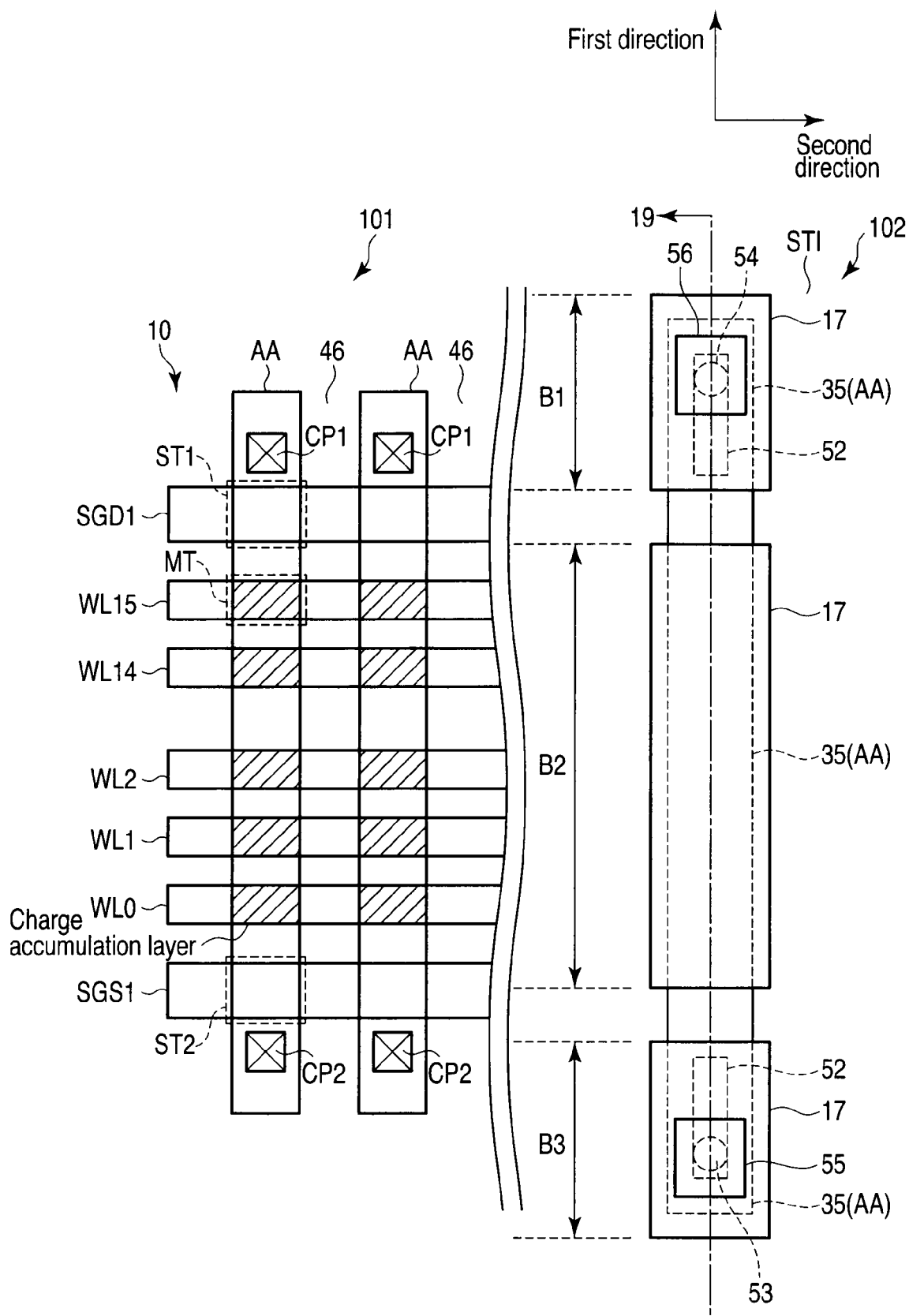
FIG. 18 is a plan view of a memory cell array and a resistance element according to a second embodiment of the present invention.

FIG. 18 is a plan view of the memory cell array explained in the first embodiment and a resistance element according to the present embodiment. Since a memory cell array 101 has the same configuration as that of the first embodiment, explanation thereof is omitted. A resistance element 102 is formed within a semiconductor substrate 10 in stripe-shaped active regions AA extending along a first direction. A device isolation region STI is formed so as to surround the active regions AA. A configuration of the device isolation region STI has the same configuration as that of the device isolation region STI within the memory cell array 101. That is, the device isolation region 47 is formed so as to surround the active region.

A polysilicon layer 35 is formed on the active region AA via a gate insulating film 33. A metal silicide layer 17 is formed on the polysilicon layer 35 via an insulating film 16. In each active region AA, the insulating film 16 and the metal silicide layer 17 are divided into three regions along the first direction. The three regions are hereinafter called "regions B1, B2, and B3". Incidentally, regions B1 and B3 are regions of the resistance element positioned on both sides along the first direction, while region B2 is a central region sandwiched between regions B1 and B3 along the first direction. In FIG. 18, since the active region AA and the polysilicon layer 35 have the same plan pattern, the both is indicated by reference number 35 (AA).

The metal silicide layer 17 in region B1 is connected to a metal interconnect layer 56 via a contact plug 54, and the metal silicide layer 17 in region B3 is connected to a metal interconnect layer 55 via a contact plug 53. That is, one end of the resistance element shown in FIG. 18 is connected to the metal interconnect layer 56, and the other end thereof is connected to the metal interconnect layer 55.

Figure 19:
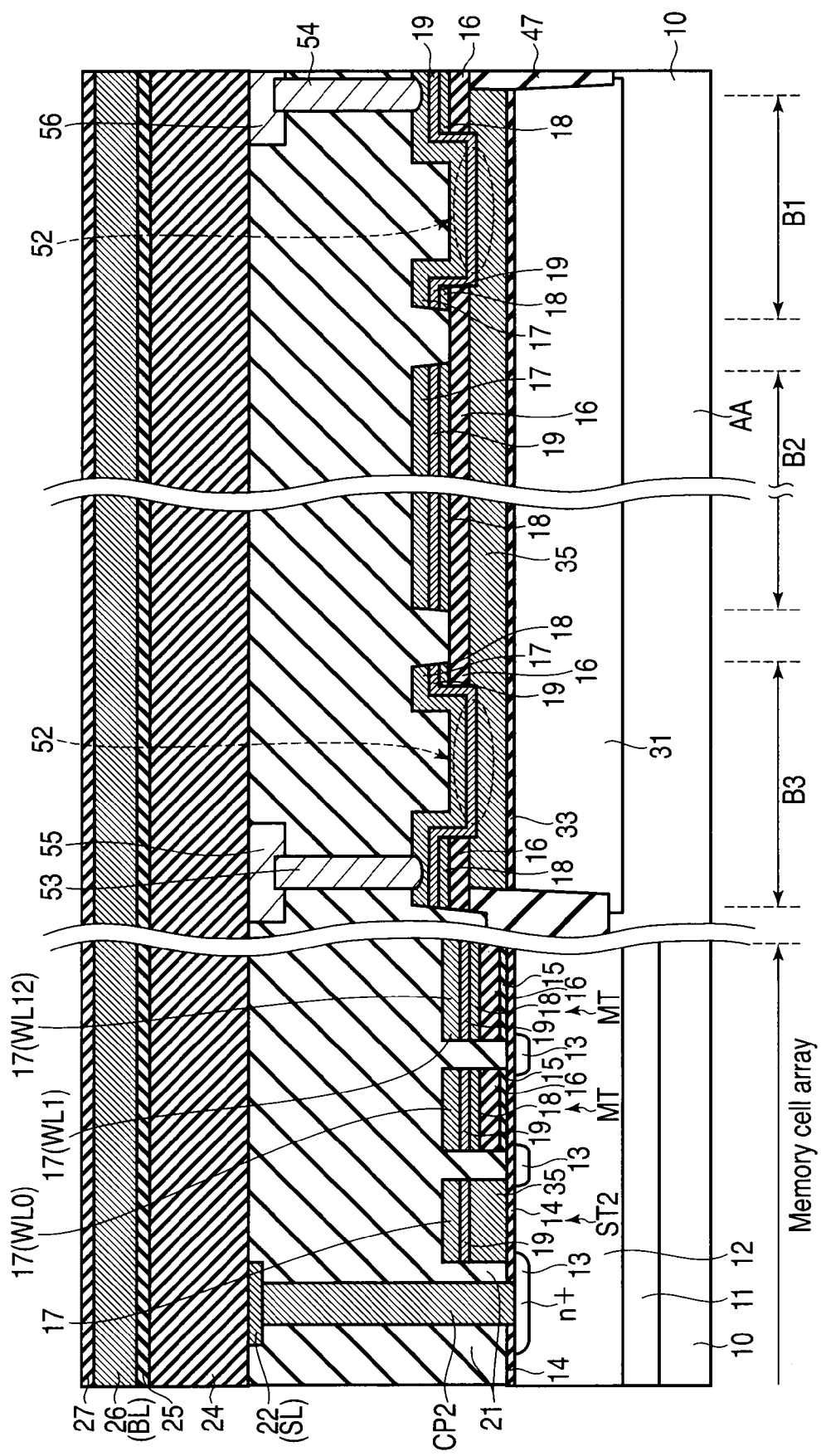
FIG. 19 is a sectional view of the memory cell array and the resistance element, taken along line 19-19 in FIG. 18.

Next, in the abovementioned structure, a sectional view of the resistance element taken along line 19-19 in FIG. 18 is shown in FIG. 19. As illustrated in FIG. 19, a polysilicon layer 35 is formed on the active region AA via a gate insulating film 33. A metal silicide layer 17 is formed on the polysilicon layer 35 via an insulating film 16 and a metal layers 18 and 19. The metal layers 18 and 19 and the metal silicide layer 17 have been removed from a boundary portion between region B1 and region B2 and a boundary portion between region B2 and region B3. Thereby, the metal silicide layer 17 in region B1 and the metal silicide layer 17 in region B2 are electrically isolated from each other, and the metal silicide layer 17 in region B2 and the metal silicide layer 17 in region B3 are electrically isolated from each other.

In each of regions B1 and B3, an opening portion 52 is formed by removing a portion of the insulating films 16, and the polysilicon layer 35 and the metal silicide layer 17 are electrically connected to each other via the metal layer 19, via the opening portion 52. On the other hand, in region B2, the polysilicon layer 35 and the metal silicide layer 17 are electrically isolated from each other by the insulating film 16.

With the abovementioned configuration, the polysilicon layer 35 functions as a substantial resistance portion of the resistance element, and the metal silicide layers 17 in regions B1 and B3 function as electrodes of one end and the other end of the resistance element. Incidentally, the metal silicide layer 17 is a metal silicide layer fully silicided.

An interlayer insulating layer 21 is formed on the semiconductor substrate 10 so as to cover the resistance element. Contact plugs 54 and 53 connected to the metal silicide layers 17 in regions B1 and B3 are formed in the interlayer insulating film 21 and metal interconnect layers 56 and 55 connected to the contact plugs 54 and 53 are formed therein. An interlayer insulating layer 24, an interlayer insulating layer 25, a metal interconnect layer 26, and an insulating layer 27 are sequentially formed on the interlayer insulating film 21 like that shown in FIG. 3 regarding the first embodiment.

A gate insulating film 37 having a film thickness larger than that of the gate insulating film 33 may be used instead of the gate insulating film 33. As a result, it is possible to apply high potential to the resistance element.

Incidentally, in FIG. 19, the contact plugs 53 and 54 and the metal interconnect layers 55 and 56 are illustrated as separated pieces but they may be formed integrally at the same step. Further, in FIG. 18 and FIG. 19, only one resistance element is shown, but a plurality of resistance elements can be provided. By configuring a resistance element such as described above, the resistance element and the memory cell array can be formed simultaneously.

<Manufacturing Method of Resistance Element 102>

Next, a manufacturing method of the resistance element 102 will be explained. First, the steps from FIG. 6 to FIG. 13 explained regarding the first embodiment are conducted. In the present embodiment, however, an opening portion 52 is formed by removing the metal film 18 and the insulating film 16 in regions of region A2 or region A3 at the step shown in FIG. 13 corresponding to regions B1 and B3 shown in FIG. 19. At this time, the metal film 18 and the insulating film 16 are left in a region of regions A2 and A3 shown in FIG. 13 corresponding to region B2. Since steps performed thereafter are the same as the steps shown in FIGS. 14 to 17, explanation thereof is omitted.

Thereafter, regions B1 to B3 are covered with a resist mask, for example, and the metal silicide layer 17, the metal layers 18 and 19, and the insulating film 16 are removed by etching. As a result, the structure shown in FIG. 19 is formed.

Effect According to this Embodiment

As described above, according to the semiconductor memory device and the manufacturing method thereof according to the second embodiment, an effect described in the following (2) can be obtained. It is also expected to achieve not only the effect (2) but also the effect (1) described above simultaneously. (2) Manufacturing steps can be shortened.

With the configuration according to the present embodiment, simultaneously with formation of the memory cell array 101 explained in the first embodiment, the resistance element 102 can be formed on the same substrate. Therefore, the manufacturing steps can be reduced. Further, as shown in FIG. 19, the metal layer 19 is formed on the polysilicon layer 35 used as the resistance element in regions B1 to B3. That is, when the polysilicon layer 28 is fully silicided, the polysilicon layer 35 is prevented from being silicided by the metal film 19. As a result, resistance of the gate of the memory cell transistor MT can be reduced and a resistance element with high resistance can be formed.

Modified Embodiment of Manufacturing Method

Figure 20:
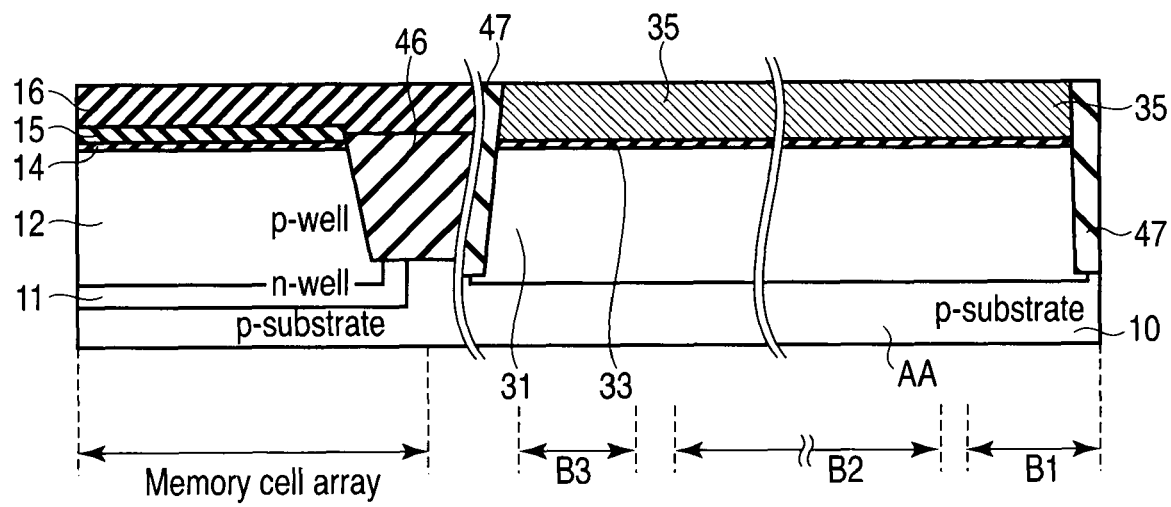
FIG. 20 is a sectional view showing a portion of a manufacturing step of a memory cell array and a resistance element according to a modified embodiment of the second embodiment of the present invention.
Figure 21:
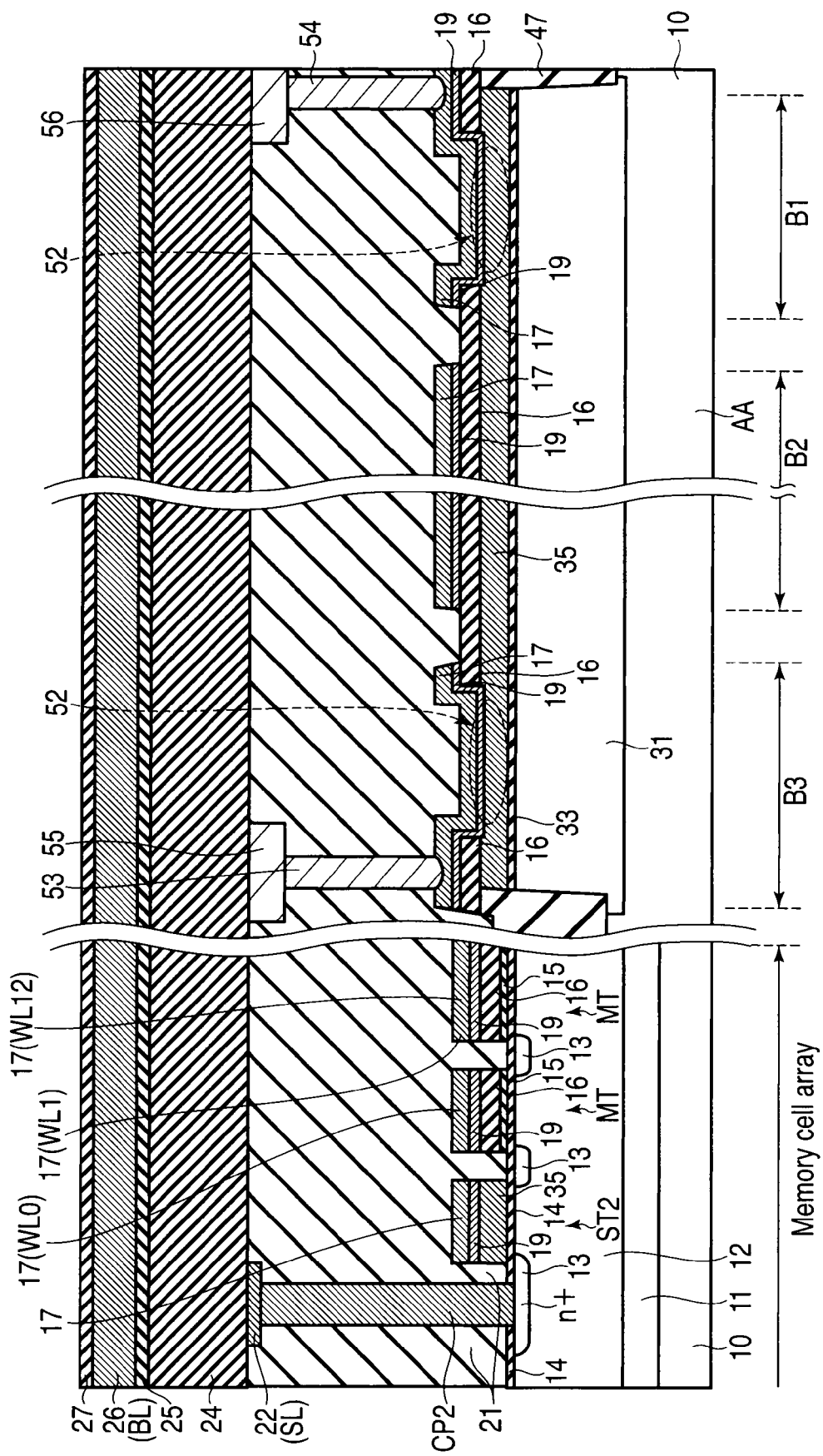
FIG. 21 is a sectional view of the memory cell array and the resistance element according to the modified embodiment of the second embodiment of the present invention.

At the step shown in FIG. 12 and explained regarding the first embodiment, as shown in FIG. 20, an upper face of the polysilicon layer 35 in a region scheduled for forming a peripheral transistor and an upper face of the insulating film 16 functioning as a block layer of a region scheduled for forming a memory cell transistor MT may be caused to coincide with each other. Thereafter, the insulating film 16 is removed at the opening portions 52 in regions B1 and B3 without forming the metal layer 18. Since steps performed after formation of the metal layer 19 are the same as the steps shown in FIGS. 14 to 17, explanation thereof is omitted. In this case, a memory cell array and a resistance element shown in FIG. 21 are formed.

As a result, a difference between the upper face of the metal silicide layer 17 except for the opening portions 52 in regions B1 to B3 and the upper face of the metal silicide layer 17 of the opening portion 52 becomes small, so that a process margin for the metal interconnect layers 55 and 56 is improved.

Incidentally, the memory cell included in the NAND cell 5 shown in FIG. 2 may be of FG type. In a case of the FG type, a stacked layer gate includes a charge accumulation layer (a floating gate: conductive layer) formed on a semiconductor substrate via a gate insulating film and a control gate formed on the floating gate on an inter-gate insulating film. In this case, the control gate is fully silicided.

Incidentally, the polysilicon layer 35 of each of the peripheral transistors PT1 and PT2 may be formed, for example, by sputtering, for example, TaN, WN, W, or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell transistor comprising a first stacked layer gate including a first insulating film formed on a first active region in a semiconductor substrate via a first gate insulating film, for accumulating charges, a second insulating film formed on the first insulating film using material having dielectric constant higher than that of the first insulating film, and a control gate electrode formed so as to include a first metal film formed on the second insulating film and a first conductive film formed on the first metal film and comprising a silicide film, and a first impurity diffusion layer functioning as a source and a drain;
a first MOS transistor comprising a second stacked layer gate including a second conductive film formed on a second active region in the semiconductor substrate via a second gate insulating film, a second metal film formed on the second conductive film, and a third conductive film formed on the second metal film and comprising a silicide film, and a second impurity diffusion layer functioning as a source and a drain; and
a second MOS transistor comprising a third stacked layer gate including a fourth conductive film formed on a third active region in the semiconductor substrate via a third gate insulating film, a third metal film formed on the fourth conductive film, and a fifth conductive film formed on the third metal film and comprising the silicide film, and a third impurity diffusion layer functioning as a source and a drain,
wherein a thickness of the third gate insulating film is larger than that of the second gate insulating film, upper faces of the second gate insulating film and the third gate insulating film are located at a same level, and upper faces on the second metal film and the third metal film are located at a same level.

2. The device according to claim 1, wherein the second metal film is a silicidation prevention film preventing the second conductive film from being silicided, and
the first conductive film and the third conductive film have the same film thickness and upper faces thereof are located at a same level.

3. The device according to claim 1, wherein the second conductive film comprises any of metal films formed of TaN, WN, and W.

4. The device according to claim 1, wherein the third metal film is a silicidation prevention film preventing the fourth conductive film from being silicided, and upper faces of the third conductive film and the fifth conductive film are located at a same level.

5. The device according to claim 1, wherein concentrations of the first and the second diffusion layers are different from each other.

6. The device according to claim 1, wherein a whole upper face of the second conductive film comes in contact with the second metal film, and
a whole upper face of the fourth conductive film comes in contact with the third metal film.

7. The device according to claim 1, wherein material for forming the first metal film is selected in consideration of the erase characteristic such that energy difference between a conduction band of the second insulating film and Fermi level of the first metal film occurs.

8. The device according to claim 1, wherein the first metal film and the second metal film are formed of the same material, and are formed of TiN or TaN.

9. The device according to claim 1, wherein the first metal film has a multi-layer structure, and an uppermost layer of the first metal film is made from the same material as the second metal film, and an upper face of any of lower layers of the first metal film is located at a same level as an upper face of the second conductive film.

10. A semiconductor memory device comprising:
a memory cell transistor comprising a first stacked layer gate including a first insulating film formed on a first active region in a semiconductor substrate via a first gate insulating film, for accumulating charges, a second insulating film formed on the first insulating film using material having dielectric constant higher than that of the first insulating film, and a control gate electrode formed so as to include a first metal film formed on the second insulating film and a first conductive film formed on the first metal film and made of a silicide film, and a first impurity diffusion layer functioning as a source and a drain; and
a resistance element comprising a second conductive film formed on a second active region in the semiconductor substrate via a second gate insulating film, a third insulating film formed on the second conductive film, and a plurality of third conductive films formed on the third insulating film via a second metal film, comprising a silicide film, and connected to the second conductive film at a partial region.

11. The device according to claim 10, wherein the second conductive film comprises any of metal films formed of TaN, WN, and W.

12. The device according to claim 10, wherein material for forming the first metal film is selected in consideration of the erase characteristic such that energy difference between a conduction band of the second insulating film and Fermi level of the first metal film occurs.

13. The device according to claim 10, wherein the plurality of the third conductive films are formed of first to third portions, the third conductive film is connected to the second conductive film in the first and the second portions, and the third conductive film is not connected to the second conductive film in the third portion.

14. The device according to claim 13, wherein the second conductive film is used as a resistance body.

15. A manufacturing method of a semiconductor memory device comprising:
   forming first polysilicon on a first active region via a first gate insulating film;
   forming a first insulating film functioning as a charge accumulation layer via a second gate insulating film and a second insulating film having dielectric constant higher than that of the first insulating film and functioning as a block film on the first insulating film in a second active region;
   forming a first metal film on the first polysilicon, and a second metal film whose upper face is located at a same level as an upper face of the first metal film on the second insulating film;
   forming a second polysilicon and a third polysilicon on the first metal film and the second metal film, respectively;
   forming a gate electrode of a memory cell transistor by patterning the third polysilicon, the second metal film, and the first and second insulating films;
   forming a gate electrode of a MOS transistor by patterning the first and second polysilicons and the first metal film; and
   fully siliciding the second and third polysilicons, while preventing silicidation of the first polysilicon by the first metal film
   wherein the second metal film has a multi-layer structure, and an uppermost layer of the second metal film is formed of a same material as the first metal film, and an upper face of any of lower layers of the second metal film is located at a same level as an upper face of the first polysilicon.

16. The method according to claim 15, wherein material for forming the first metal film is selected in consideration of the erase characteristic such that energy difference between a conduction band of the second insulating film and Fermi level of the first metal film occurs.

17. The method according to claim 15, wherein the second insulating film is formed using $Al_2O_3$ as material, and the first metal film and the second metal film are formed using TiN or TaN as material.

* * * * *